(12) United States Patent
Zacherl et al.

(10) Patent No.: US 11,454,656 B2
(45) Date of Patent: Sep. 27, 2022

(54) SIGNAL GENERATING DEVICE AND MEASUREMENT DEVICE

(71) Applicant: LISA DRAEXLMAIER GMBH, Vilsbiburg (DE)

(72) Inventors: Christian Zacherl, Bockhorn (DE); Andreas Kempf, Fuessen (DE); Vencislav Todorov, Vienna (AT); Thomas Mayer, Ast (DE)

(73) Assignee: LISA DRAEXLMAIER GMBH, Vilsbiburg (DE)

( * ) Notice: Subject to any disclaimer, the term of this patent is extended or adjusted under 35 U.S.C. 154(b) by 0 days.

(21) Appl. No.: 17/237,719

(22) Filed: Apr. 22, 2021

(65) Prior Publication Data
US 2021/0239745 A1 Aug. 5, 2021

Related U.S. Application Data

(63) Continuation of application No. PCT/EP2018/078844, filed on Oct. 22, 2018.

(51) Int. Cl.
*G01R 21/06* (2006.01)
*G01R 21/00* (2006.01)
(Continued)

(52) U.S. Cl.
CPC .......... *G01R 21/06* (2013.01); *G01R 21/006* (2013.01); *G01R 21/01* (2013.01); *G01R 31/2841* (2013.01); *G01R 31/006* (2013.01)

(58) Field of Classification Search
CPC ...... G01R 21/06; G01R 21/006; G01R 21/01; G01R 31/2841; G01R 31/006; G01R 1/04;
(Continued)

(56) References Cited

U.S. PATENT DOCUMENTS

2013/0285683 A1* 10/2013 Heiland, Jr. ....... G01R 29/0835
324/750.3
2017/0268974 A1* 9/2017 Brown .................. G01N 9/002
(Continued)

FOREIGN PATENT DOCUMENTS

DE 102010045983 5/2011

OTHER PUBLICATIONS

Zoran Vrankovic et al., Novel Double Clamp Methodology to Reduce Shielded Cable Radiated Emissions Initiated by Electronic Device Switching, 53-1 IEEE Trans. Industry Apps. 327 (Jan./Feb. 2017) (Year: 2017).*

(Continued)

*Primary Examiner* — Tung X Nguyen
*Assistant Examiner* — Robert P Alejnikov, Jr.
(74) *Attorney, Agent, or Firm* — Burris Law, PLLC (57) ABSTRACT

A signal generating device for generation of measurement signals for an electrical system includes a housing which features an electrically conducting material, an energy reservoir arranged in the housing, a data interface arranged at the housing and designed to receive signal data, a coupling interface arranged at the housing and coupled to the electrical system, and a signal generator arranged in the housing. The signal generator is coupled to the electrical energy reservoir, to the data interface and to the coupling interface. The signal generator is designed, based on the signal data, to generate the measurement signals and to output them via the coupling interface. A corresponding measuring device is also included.

13 Claims, 3 Drawing Sheets

(51) Int. Cl.
*G01R 21/01* (2006.01)
*G01R 31/28* (2006.01)
*G01R 31/00* (2006.01)

(58) Field of Classification Search
CPC ... G01R 1/18; G01R 31/001; B60L 2270/147;
B60L 3/0023; B60L 3/0046; B60L 58/10;
Y02T 10/70
USPC .................................................. 324/612, 142
See application file for complete search history.

(56) References Cited

U.S. PATENT DOCUMENTS

2018/0172729 A1* 6/2018 Kirst ........................ G01D 3/08
2018/0287383 A1* 10/2018 Freitag .................... G06F 1/263

OTHER PUBLICATIONS

International Electrotechnical Commission, International Standard—Vehicles, boats and internal combustion engines—Radio disturbance characteristics—Limits and methods of measurement for the protection of on-board receivers, CISPR 25:2016 , Oct. 27, 2016, pp. 1-320, Edition 4.0, IEC, Switzerland.
International Search Report for International Application PCT/EP2018/078844, dated Jul. 11, 2019.

* cited by examiner

SIGNAL GENERATING DEVICE AND MEASUREMENT DEVICE

CROSS-REFERENCE TO RELATED APPLICATIONS

This application is a continuation of International Application No. PCT/EP2018/078844, filed on Oct. 22, 2018. The disclosure of the above application is incorporated herein by reference.

FIELD

The present disclosure relates to a signal generating device. Furthermore, the present disclosure relates to a corresponding measuring device.

BACKGROUND

The statements in this section merely provide background information related to the present disclosure and may not constitute prior art.

The present disclosure will be described below primarily in connection with electrical interference in motor vehicles. But it is understood that the present disclosure can also be used in other electrical applications.

In modern motor vehicles, one of the development goals is to reduce the fuel consumption and thus the emission of pollutants. This may be a requirement, for example, to satisfy corresponding legal mandates.

Besides increasing the efficiency of conventional internal combustion engines, alternative propulsion concepts are also being employed to reduce the emission of pollutants. These alternative propulsion concepts may supplement the internal combustion engines with electric motors in what are known as hybrid vehicles, or as electric vehicles.

The employment of powerful electric motors in vehicles requires a corresponding voltage supply and control electronics which can process the relevant voltages and currents. An electric propulsion motor for an electric vehicle can be operated for example, at voltages of 400 V or even more than 800 V, and currents of a plurality of hundreds of amperes can flow in the system.

Usually a conventional low voltage onboard network of for instance, 12 V is also provided in an electric vehicle, which is also supplied from the high voltage battery. For this purpose, a DC/DC converter is provided which converts the voltage from the high voltage battery to the corresponding network voltage of the low voltage onboard network.

But, in particular, the presence of the large currents in the power train can result in interference in the low voltage or very low voltage onboard network. Therefore, appropriate measures should be taken in the electrical or electronic components of the power supply of such motor vehicles to dampen the interference from the high voltage portion of the onboard network into the low-voltage portion of the onboard network.

Appropriate measurements should be taken in the development and also in the permitting of a vehicle, and based on these measurements, the coupling attenuation can be determined and verified.

Conventional measurement methods, however, are very susceptible to external interference and do not provide reproducible results.

SUMMARY

This section provides a general summary of the disclosure and is not a comprehensive disclosure of its full scope or all of its features.

The present disclosure provides an improved possibility for measuring the coupling attenuation in electric systems while using means of the simplest possible design.

The signal generating device for generation of measurement signals for electrical systems, according to the present disclosure features a housing which features an electrically conducting material, an energy reservoir which is arranged in the housing, a data interface which is arranged at the housing and which is designed to receive signal data, a coupling interface which is arranged at the housing and which can be coupled to the electrical system, and a signal generator which is arranged in the housing and which is coupled to the electrical energy reservoir and to the data interface and to the coupling interface, wherein the signal generator is designed, based on the signal data, to generate the measurement signals and to output them via the coupling interface.

A measurement device for an electrical system according to the present disclosure features: a signal generating device according to the present disclosure which is coupled on the input side to the electrical system, and a measurement device which is coupled on the output side to the electrical system and is designed to detect electrical signals in the electrical system.

In this regard the "input side" means that the signal generating device is coupled to the connector or to the connectors of the electrical system from which the measurement signals are to be injected. The "output side" means that the measurement device is coupled to the connection or the connections of the electrical system at which the measurement is to be performed.

The present disclosure is based on the finding that in the measurement of coupling attenuation in the electrical components of a motor vehicle, for example, in a corresponding battery controller (also called the high voltage switch box), the measurement equipment usually produces interference that can adversely affect the measurement. Thus, the results previously obtained are difficult to reproduce. For example, supply lines to the corresponding coupling units, such as to the current clamps, emit interference signals which are then picked up by the measurement equipment.

For example, prior art shield housings can be provided over an external generator together with a coaxial cable. To suppress interference, chokes can be used, but they must not act across the entire frequency range. Furthermore, in this design, different reference grounds exist to the individual devices, and also different cable lengths of the signal transmission and resultant emission from the coaxial cable which make it impossible to obtain reproducible measurement results.

Therefore, the present disclosure provides a signal generating device which operates as an autonomously powered and shielded unit to generate the measurement signals and their transmission to the electrical system being tested.

The signal generating device herein features a housing made of an electrically conducting material, e.g. of aluminum (steel-)metal-plate or the like. The housing acts as an accommodation space for the additional components of the signal generating device and simultaneously shields them so that no interference signals can leave the housing.

A power supply is provided in the housing and provides the power to the individual components of the signal generating device. The power supply can be, for example, a (rechargeable) battery, a fuel cell or similar item.

To generate the measurement signals, a signal generator is arranged in the housing and is supplied with electric power from the energy reservoir. The signals to be generated can be supplied to the signal generator via a data interface which is coupled to the signal generator. Furthermore, the signal generator is coupled to the coupling interface and thus outputs the generated measurement signals to the electrical system.

The present disclosure combines all relevant components of the signal generating device within the housing and supplies them independently with electric power for operation. Interference signals which are generated by the signal generator, for example, are consequently shielded within the housing and cannot leave it.

If corresponding measurements are carried out on the electrical system, then consequently they are not adversely affected by interference emissions from the signal generation chain.

Using the design of the signal generating device according to the present disclosure, a possibility is provided for generating measurement signals, in particular to measure the coupling attenuation in electrical systems of electric vehicles, with reduced emitted interference. Consequently, the measurement accuracy and thus also the reproducibility of measurements can be increased.

Additional forms and refinements are indicated in the dependent claims and from the description with reference to the Figures.

In one form, the signal generating device can feature a plurality of, that is, one or several, load simulators which are arranged in the housing and which are arranged electrically between the coupling interface and the signal generator.

The load simulators can also be designated for example, as onboard network simulators. The load simulators can feature corresponding capacitances and inductances which simulate the presence of a real onboard network for the connected electrical system. The load simulators herein can simulate in particular the impedances of the onboard network in the HF/VHF range. The load simulators herein can be designed in accordance with ISO 7637 or CISPR 25/ISO 11452-4, for example. For instance, the load simulators can each feature an inductance between two load connections and also a capacitance between the load connections and ground. Of course, additional elements, such as resistors, are likewise possible.

It is understood that for the measurement of battery controllers or of high-voltage switch boxes, for example, one load simulator can be provided for each pole of the battery controllers. In a conventional high-voltage battery, consequently one load simulator can be provided for the positive battery pole and one load simulator for the negative battery pole. It is understood that more or fewer than two load simulators can be provided for different applications.

The load simulators act as interfaces between the signal generator and the electrical system under test. Consequently, the signal generator is coupled to the load simulators and injects the generated measurement signals into the load simulators. The load simulators form a transmission path along which the measurement signals are transmitted to the coupling interface and from there to the electrical system under test.

In one additional form, the load simulators can feature on the input side, that is, in the direction of the signal generator, a first input line and a second input line, wherein the first input line is coupled to the signal generator and wherein the second input line features a terminating resistor. Furthermore, the load simulators can each feature an input switch which is designed to switch to the first input line or to the second input line, respectively.

The input switch in the load simulators makes it possible to select whether the particular load simulator either receives the received measurement signals or is terminated by a terminating resistor of e.g. 50 Ohms (different values also possible).

In particular, in the case of multi-pole configurations, for example, only one of the poles of the electrical system may be supplied with a measurement signal. If vehicle batteries and/or the corresponding control units or power systems are subjected to a test, then only the positive or the negative pole of the particular system can be supplied with the measurement signals, while the second pole can be correctly excluded.

It is understood that the input switch or selector switch can be manually operated, and can be adjusted accordingly before beginning a measurement. In this case, for example, the housing can be opened and then closed again after adjusting of the input switch (e.g. screwed down).

Alternatively, the input switch can also be electronically controlled. Corresponding control signals can be transmitted (e.g. across the data interface or across a separate control interface) to the input switch.

It is understood that the input switch can be arranged in the particular load simulator, but also can be provided as a separate element in the housing.

In an additional form, the signal generating device can feature a current clamp for each of the load simulators, wherein the current clamps can be arranged around the particular first input line and wherein the signal generator can be coupled to the current clamps in order to inject the corresponding measurement signal into the particular input line.

Current clamps have the advantage that the measurement signals can be injected into the first input lines without any jump in impedance. Consequently, reflections at the injection point are inhibited, which otherwise might result in interference emissions.

It is understood that depending on the application, a contact-based coupling between the signal generator and the first input lines is possible. For example, the signal generator can be coupled by one cable directly to the first input cables.

In an additional form, the signal generating device can feature a calibration unit which is coupled to the load simulator and the signal generator and which can be designed to set a signal level in the signal generator for the particular measurement signal such that a specified default level is set in the corresponding load simulator.

Since the signal transmission occurs in a contactless manner, that is, via the current clamps, due to corresponding controllers it is possible to set different signal levels in the load simulators. To increase the accuracy in generation of the measurement signals, the calibration unit can also be provided. The calibration unit is used to control the output level of the signal generator, such that the corresponding desired level, e.g. of 50 dB µV, is set in all load simulators. In this regard the calibration unit can adjust the output level of the signal generator for the measurement signals, that is, increase or reduce it, until the desired level is adjusted in the load simulators. The calibration unit thus can be coupled into the signal generator and set it accordingly by using correspondingly adjustable amplifiers or voltage sources.

It is understood that the calibration unit can be designed to supply the signal generator with a corresponding calibration signal, or to control it so that it produces a corresponding calibration signal.

It is understood that the calibration can also occur one time, for example, in the production of the signal generating device. For this kind of calibration, corresponding measurement connections can be provided on the load simulators which allow a measurement of the level within the load simulators. The calibration unit can also be coupled to the load simulators over these measurement connections.

In another form, the signal generating device can feature a switching device which can be arranged between signal outputs of the signal generator and the load simulators, wherein the switching device can be designed to couple the signal outputs to the load simulators in a controlled manner.

The switching device, also called the switching matrix, is used for dynamic configuration of the signal generating device in operation. The switching device herein can be designed, for example, to couple a signal output of the signal generator to a corresponding load simulator, or to disconnect from it. But the switching device can also be designed to couple any particular signal outputs to any particular load simulators. A corresponding switch matrix with electronic or electro-mechanical switches, such as transistors or relays, for example, can be provided in the switch matrix for this purpose.

If current clamps are used for coupling of the measurement signals, it is understood that the switching matrix is arranged between the signal generator and the current clamps, and the outputs of the switching matrix are each coupled to one of the current clamps.

In an additional form, the housing can feature two chambers which are separated from each other by an electrically conducting wall, wherein in the first chamber the energy reservoir and the signal generator can be arranged, and wherein in the second chamber the coupling interfaces can be arranged.

Due to the organization into two chambers it is possible to dispose those elements that generate interference in one of the chambers and to dispose the signal feed in the second chamber. Since the two chambers are separated from each other by an electrically conducting wall, the interference from the first chamber is not passed directly into the second chamber.

It is understood that cables from the first chamber can be laid into the second chamber in order to transmit the measurement signals. But the transmission of interference through these cables is effectively inhibited or suppressed, since the geometric arrangement of the two chambers in the housing can reduce the cable lengths.

In an additional form the switching device can be disposed in the first chamber. Furthermore, the load simulators and the current clamps can be disposed in the second chamber.

As was already explained above, it is possible to place those elements that generate or emit interference in one of the first chambers, and to place the other elements in the second chamber in order to reduce the interference emissions into the electrical system.

In an additional form, in the second chamber a number of, that is, one or a plurality of removable electrically conducting walls can be provided. Thus, the load simulators can each be separated from each other by one of the removable electrically conducting walls.

Due to the removable electrically conducting walls, the individual load simulators are shielded against each other in individual chambers. It is thus possible to supply each of the load simulators with its own measurement signal, without mutually affecting the individual measurement signals.

But a measurement can also be performed in which an individual measurement signal is to be supplied to two load simulators. Thus, the corresponding removable electrically conducting wall can be removed and a current clamp can be laid across the two corresponding first input lines. In this manner, it can be assured that both first input lines can be supplied with identical signals.

It is understood that alternatively the switching device can be designed to duplicate an individual input signal and to emit it to two or more outputs.

In another form, the housing can feature a first shell which forms the first chamber. Furthermore, the housing can feature a second shell which forms the second chamber. The second shell can seal the first chamber in the assembled state, and a cover can be provided for the second chamber.

It is understood that alternatively also the first shell can form the second chamber, and that the second shell can form the first chamber.

For example, the two shells can be screwed, glued or welded together. Likewise the cover for the second shell can be screwed, glued or welded. However, screwing is particularly advantageous when access to the second chamber is desired, e.g. to remove the separating walls.

The shells can feature, for example, a rectangular or square base surface. The height of the walls can be adapted to the elements that are to be positioned in the particular chamber.

The shells enable a very simple assembly of the individual elements of the signal generating device. The assembly of the entire signal generating device with the shells is consequently very simple.

In an additional form, the housing can feature an opening which can be designed to allow access to the energy reservoir, wherein a removable electrically conducting covering can be provided which is designed to seal the opening.

As was already explained above, the energy reservoir can feature batteries, for example. Consequently these batteries must be regularly replaced or recharged. This replacement or recharging can take place through the opening. The covering is configured such that during operation no interfering emissions emerge through the opening.

It is understood that the covering can be screwed to the housing wall, for example. Different kinds of attachment, such as with clamps, are likewise possible.

In an additional form, the housing can feature a ventilation opening in which a honeycomb vent is disposed, wherein the ventilation opening can be disposed in particular so as to enable an air stream to the signal generator.

The signal generator is a component that can feature, for example, amplifiers and other active elements. The power loss of the signal generator thus can lead to significant heating. Common signal generators can produce about 50 W-60 W of power loss. Consequently the ventilation opening allows a dissipation of the heat generated in the housing.

Due to the honeycomb vent it is provided that no interference will leave or be emitted from the housing.

In one form the data interface can be designed as a light-based interface. In addition or alternatively the coupling interface can be designed as an electrical interface, in particular as a line-based interface.

The data interface can be a light waveguide interface, for example. Corresponding plugs and/or electrical jacks can be provided in the housing wall. Alternatively for example, a contactless interface can be used, for example, an infrared interface or such. Corresponding openings can be provided in the housing wall. It is understood that the openings can feature corresponding dimensions and/or shielding measures so that the emission of interference through these openings is inhibited. The signal generator can feature corresponding elements, thus for example, transceivers, for communication over the data interface.

It is understood that the data interface can be a pure control interface through which parameters can be transmitted for signal generation. This means that the signal generator can feature a corresponding control logic which evaluates the parameters and generates corresponding measurement signals. Alternatively, the signal shapes or wave shapes can be transmitted across the data interface, which will then be merely amplified or adjusted in the signal generator in order to pass them to the electrical system.

Furthermore, a distribution of the signals to the data interface can be provided. Thus it is possible also to control the switching device via the data interface.

For example, the data interface can be designed as a fiberglass-based ethernet interface. The distribution in the housing can occur for example, by a corresponding switch. It is understood that the switch can also perform a conversion to a copper-based ethernet which can be used for internal communication in the signal generating device.

Since the coupling interface passes the measurement signals to the electrical system, this system is usually designed as a cable-based interface.

In another form the signal generating device can be designed so as to be coupled to a high-voltage side of the electrical system. Furthermore, the measurement device can be designed so as to be coupled to a low-voltage side of the electrical system, wherein the measurement device can feature in particular a low-voltage load simulator.

In the measurement of the coupling attenuation factor in electrical systems for electric vehicles, usually high-voltage switch boxes are measured which feature a high-voltage connection for the high-voltage onboard network, usually of several hundred volts, and a low-voltage connection for the low-voltage onboard network, usually of a few volts, such as 12 V.

As was already explained above, the signal generating device can feature a corresponding onboard network simulation for the high-voltage side. The measuring device accordingly can feature an onboard simulation for the low-voltage side.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1:
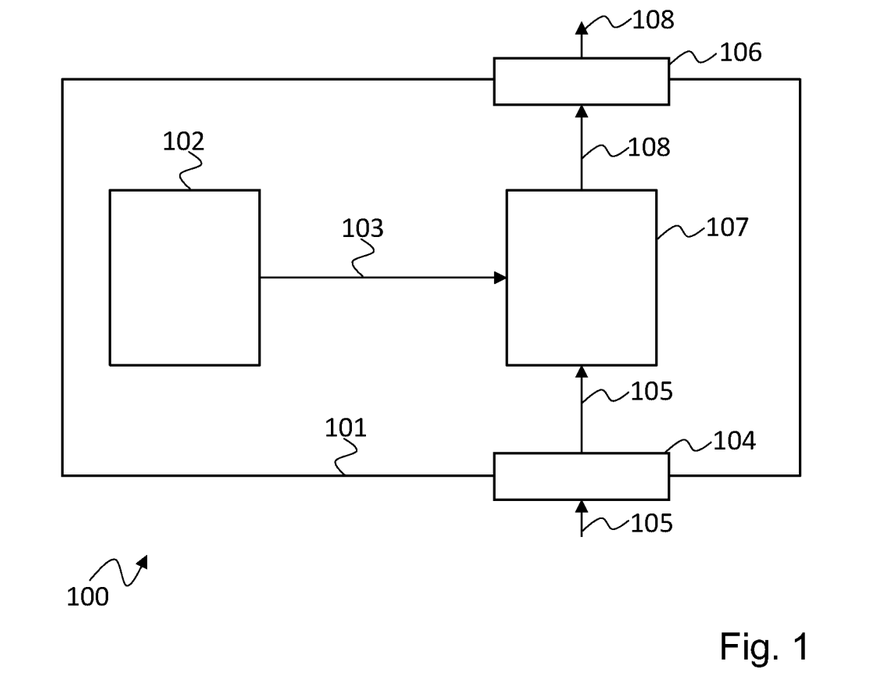
FIG. 1 shows a block circuit diagram of one form of a signal generating device according to the teachings of the present disclosure.

FIG. 1 depicts a block circuit diagram of a signal generating device 100. The signal generating device 100 features a housing 101. In the housing 101 there is an energy reservoir 102 which is coupled to a signal generator 107 in the housing 101. Furthermore, the signal generator 107 is coupled to a data interface 104 and to a coupling interface 106. In order to reduce interference emissions, the housing 101 features an electrically conducting material. Furthermore, the housing 101 can be grounded in accordance with the particular application. All elements of the signal generating device 100 that can emit interference are disposed in the housing 101 in order not to affect the measurement on the electrical system.

The energy reservoir 102 can be a battery, for example. It is understood that the energy reservoir 102 can supply electric power to the signal generator 107 and also to other elements of the signal generating device 100 and a corresponding supply voltage 103 can be made available to them.

The signal generator 107 receives the signal data 105 from the data interface 104. The signal data 105 can contain parameters, for example, that are used by the signal generator 107 to generate measurement signals 108 for injection into the electrical system being measured. Alternatively, the signal data 105 can also feature a wave shape which is merely reinforced or adapted by the signal generator 107. The generated measurement signals 108 are output from the signal generator 107 via the coupling interface 106.

To reduce any effect on the measurement due to the provision of signal data 105, the data interface 104 can be designed as a non-electromagnetic interface, thus, for example, as an optical interface which uses light waveguides for data transmission. For example, a light waveguide-based ethernet can be used.

The coupling interface 106, however, is used for transmission of the measurement signals 108 into the electrical system. The measurement signals 108 herein must have a specific power which is usually established by relevant test standards. Consequently the coupling interface 106 is a cable-based interface in which the signals are transmitted over electrically conducting lines to the electrical system.

Figure 2:
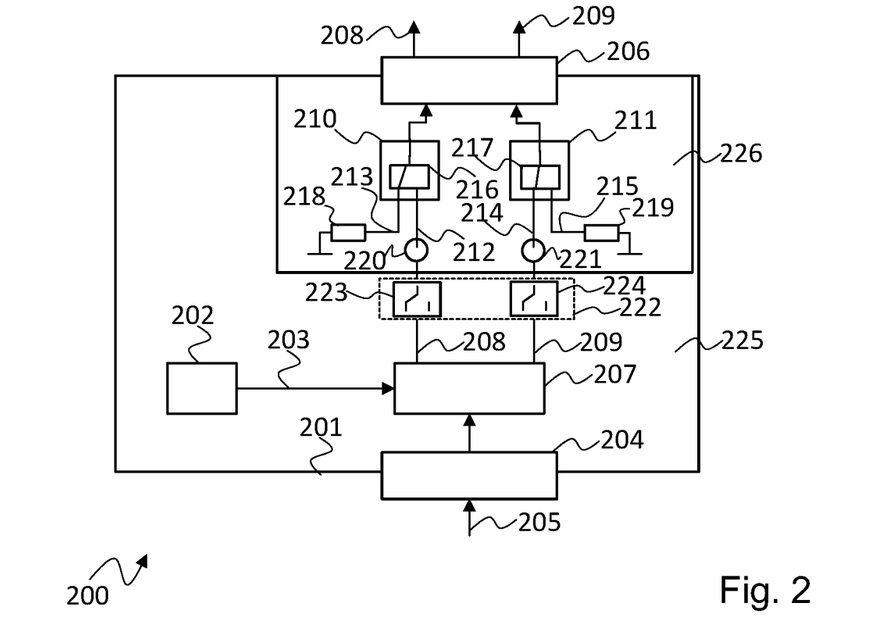
FIG. 2 shows a block circuit diagram of an additional form of a signal generating device according to the teachings of the present disclosure.

FIG. 2 depicts a block circuit diagram of a signal generating device 200. The signal generating device 200 is based on the signal generating device 100 and consequently likewise features a housing 201 in which an energy reservoir 202 is arranged, which is coupled to the signal generator 207 in the housing 201. Furthermore, the signal generator 207 is coupled to a data interface 204 and to a coupling interface 206. The discussion above relating to the data interface 104 and to the coupling interface 106 applies analogously.

The signal generator 207 in the signal generating device 200 generates two measurement signals 208, 209. The two measurement signals 208, 209 are each intended for one pole of a two-pole electrical system. An electrical system of this kind can be, for example, a high voltage switch box of a motor vehicle battery with a positive pole and a negative pole.

Furthermore, the signal generating device 200 features a switching device 222 which is coupled to the signal generator 207 and features, solely as an example, two switches 223, 224. The switching device 222 can be controlled to transmit or block the measurement signals 208, 209. It is understood that in one design, the switching device 222 can also switch an individual measurement signal to one of a plurality of outputs. Corresponding switches and/or a corresponding switch matrix can be provided in the switching device 222.

The outputs of the switch device 222 are each coupled via a current clamp 220, 221 to a first input line 212, 214 of a load simulator 210, 211. The measurement signals 208, 209 are thus transmitted across the current clamps 220, 221 to the particular load simulator 210, 211. The load simulators 210, 211 are connected on the output side to the coupling interface 206 in order to pass the measurement signals 208, 209 to the electrical system. As already explained above, the load simulators 210, 211 can simulate the impedances e.g. of a vehicle onboard network in the HF/VHF-range.

Each load simulator 210, 211 features an input switch 216, 217 which is controlled to select the particular first input line 212, 214, or a particular second input line 213, 215 as input for the corresponding load simulator 210, 211. The second input lines 213, 215 are each terminated with a resistor 218, 219.

Consequently, via the switching device 222 and the input switch 216, 217 it is easily possible to select which of the measurement signals 208, 209 are passed to the electrical system over which load simulator 210, 211.

Even though for the sake of clarity it is not explicitly illustrated, a calibration unit can also be provided. The calibration unit can be coupled to the load simulators 210, 211 and the signal generator 207. For calibration of the signal level for the current clamps 220, 221, the calibration unit in the signal generator 207 can set a signal level for the particular measurement signal 208 such that a specified default level is set in the corresponding load simulator 210, 211.

Two chambers 225, 226 are provided in the signal generating device 200. The energy reservoir 202, the signal generator 207 and the switching device 222 are arranged in the first chamber 225. The current clamps 220, 221 with load simulators 210, 211 and the resistors 218, 219 are arranged in the second chamber. Due to this arrangement in the chambers 225, 226, those elements which generate interference are separated from those elements which provide the signal transmission to the electrical system.

Figure 3:
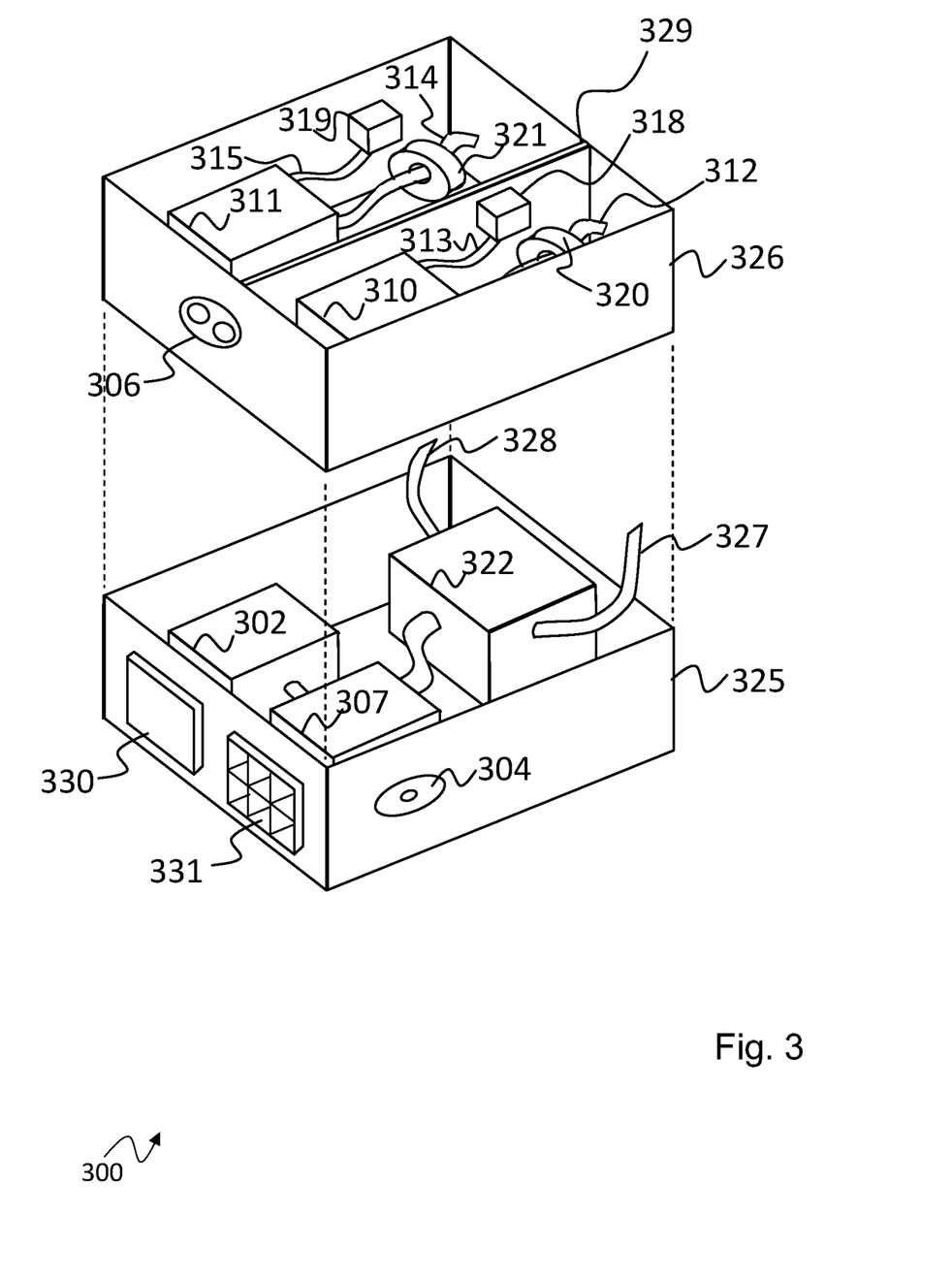
FIG. 3 shows a perspective view of one form of a signal generating device according to the teachings of the present disclosure.

FIG. 3 depicts a perspective view of a signal generating device 300. The signal generating device 300 is illustrated in a simplified manner, and it should be understood that the signal generating device 300 can feature each of the elements named above and named in the claims.

The signal generating device 300 features a first chamber 325 and a second chamber 326, which together form the housing. The chambers 325, 326 are each designed as a kind of shell or box. The second chamber 326 can be mounted to the first chamber 325 such that it seals the first chamber 325 as a kind of covering. Furthermore, a cover (not illustrated separately) can be provided for the second chamber 326. The first chamber 325 and the second chamber 326 can be screwed together, for example. In addition, a separating wall 329 is provided in the second chamber 326 which divides the second chamber 326 into two individual parcels. The separating wall 329 can be arranged as removable in the second chamber 326.

The energy reservoir 302, the signal generator 307 and the switching device 322 are arranged in the first chamber 325. To allow access to the energy reservoir 302, an opening is provided in the side wall of chamber 325 at the corresponding location which is sealed by a detachable covering 330. Furthermore, at the corresponding location of the side wall of chamber 325, a honeycomb vent 331 is provided which acts as ventilator of the signal generator 307.

The switching device 322 is coupled to the second chamber 326 via two cables 327, 328. A load simulator 310, 311 is provided in each parcel in the second chamber 326. Each load simulator 310, 311 features a first input line 312, 314 and a second input line 313, 315. A current clamp 320, 321 is provided for each of the first input lines 312, 314. The current clamps 320, 321 are provided with the particular measurement signals via the cables 327, 328. The second input lines 313, 315 are terminated by resistors 318, 319, e.g. having a value of 50 Ohms. A selection can be made in the load simulators 310, 311 of whether the first input line 312, 314 or the second input line 313, 315 is to be activated or enabled. On the output side the load simulators 310, 311 are coupled to the coupling interface 306 in order to contact the electrical system. Furthermore, the signal generator 307 is coupled to a data interface 304. The discussion above relating to the data interface 104 applies analogously to the data interface 304.

The separating wall 329 in the signal generating device 300 can be removed. This can be used, for example, to guide the two first input lines 312, 314 through an individual current clamp. Thus the same measurement signal can be applied to the two load simulators 310, 311.

Figure 4:
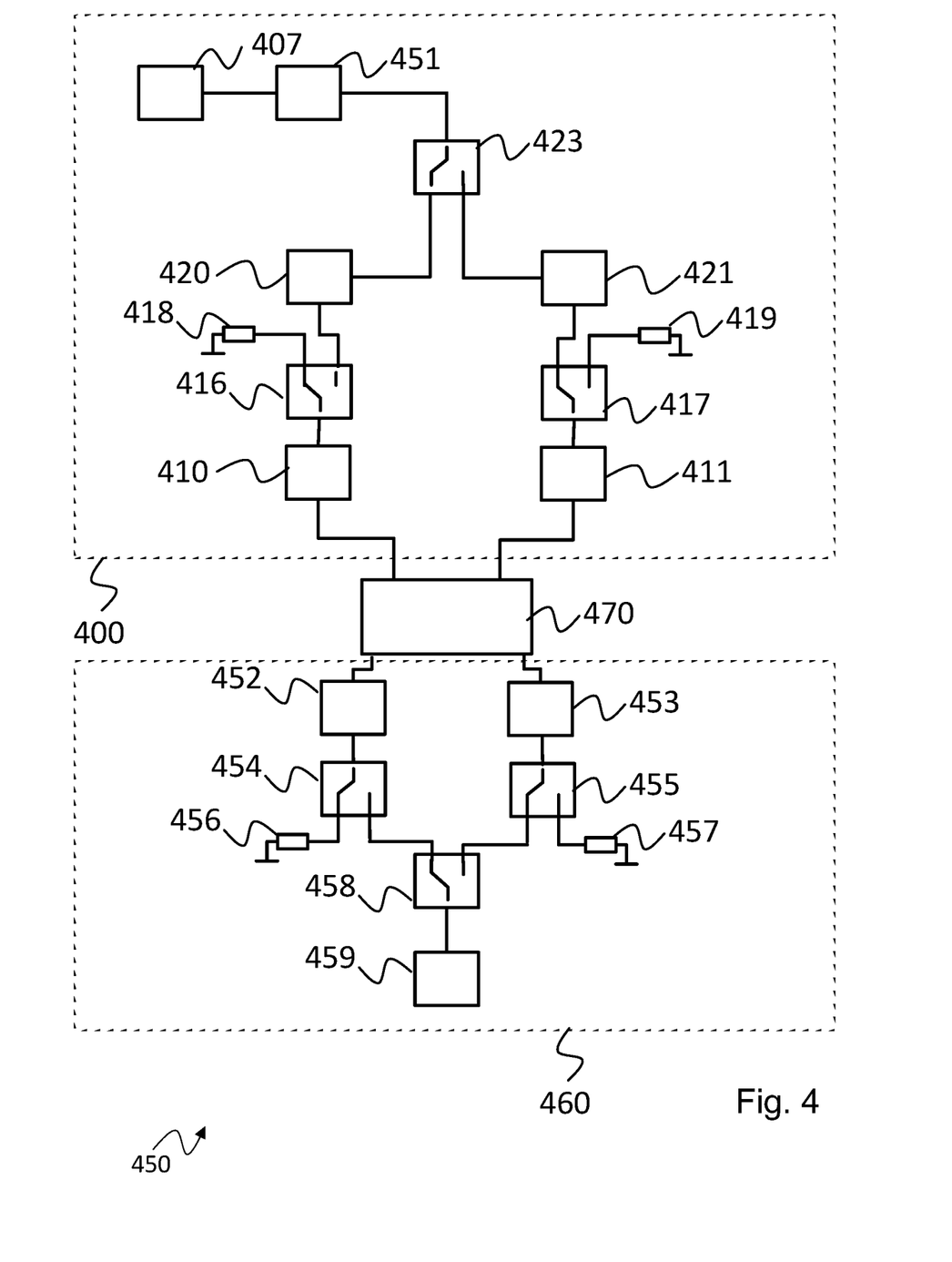
FIG. 4 shows a block circuit diagram of one form of a measurement device according to the teachings of the present disclosure.

FIG. 4 depicts a block circuit diagram of a measurement device 450. The measurement device 450 features a signal generating device 400 which is coupled to a high-voltage side of an electrical system 470. On the low-voltage side the electrical system is coupled to a measurement device 460.

The signal generating device 400 features the signal generator 407 which is coupled to a −3 dB attenuation element 451 in order to inhibit feedback into the signal generator 407. The attenuation element 451 is coupled to a switch 423 which guides an input signal, that is, a measurement signal, in a controllable manner to one of two outputs. The outputs of the switch 423 are each coupled to a current clamp 420, 421. The lines which each proceed through one of the current clamps 420, 421 are each coupled to an input switch 416, 417, which connects either the corresponding line or a line equipped with a resistor 418, 419 to its output. The outputs of the input switches 416, 417 are each coupled to a load simulator 410, 411. The load simulators 410, 411 are each connected to one pole of the high-voltage side of the electrical system 470.

On the low-voltage side, the two poles of the electrical system 470 are each coupled to an additional load simulator 452, 453. It is understood that the load simulators 452, 453 are adapted to the needs of the low-voltage side, that is, they are designed for voltages of 12 V, for example. The outputs of the load simulators 452, 453 are each coupled to a reversing switch 454, 455 which couples the load simulators 452, 453 either to a resistor 456, 457, or couples the load simulators 452, 453 to a selector switch 458. The output of the selector switch 458 is coupled to a measurement receiver 459. It is understood that the selector switch 458 can also be removed, for example, and a measurement receiver with a plurality of input channels can be used.

Since the apparatus and method described in detail above pertain to design examples, they can be modified in the usual manner by the skilled person within broad limits, without leaving the scope of the present disclosure. In particular, the mechanical arrangements and the size relationships of the individual elements to each other are provided merely as examples.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A signal generating device for generating measurement signals for an electrical system, the signal generating device comprising:
a housing comprising an electrically conducting material;
an energy reservoir arranged in the housing;
a data interface arranged at the housing and configured to receive signal data;
a coupling interface arranged at the housing and coupled to the electrical system;
a signal generator arranged in the housing and coupled to the electrical energy reservoir, the data interface, and the coupling interface, wherein the signal generator is configured, based on the signal data, to generate the plurality of measurement signals and to output the plurality of measurement signals via the coupling interface; and
a plurality of load simulators arranged in the housing, wherein the plurality of load simulators are arranged electrically between the coupling interface and the signal generator;
wherein an input side of the plurality of load simulators comprises a first input line and a second input line,
wherein the first input line is coupled to the signal generator,
wherein the second input line comprises a terminating resistor, and
wherein the plurality of load simulators comprise an input switch configured to switch to the first input line or to the second input line respectively.

2. The signal generating device according to claim 1, further comprising a current clamp for each of the plurality of load simulators, wherein a plurality of current clamps are arranged around the first input line, wherein the signal generator is coupled to the plurality of current clamps, and wherein the plurality of current clamps are configured to inject a corresponding measurement signal into a particular input line.

3. The signal generating device according to claim 2, further comprising a calibration unit coupled to the plurality of load simulators and the signal generator, wherein the calibration unit is configured to set a signal level in the signal generator for a particular measurement signal such that a specified default level is set in a corresponding load simulator.

4. The signal generating device according to claim 2, further comprising a switching device arranged between a plurality of signal outputs of the signal generator and the plurality of load simulators, wherein the switching device is configured to couple the plurality of signal outputs to the plurality of load simulators in a controlled manner.

5. The signal generating device according to claim 4, wherein the housing features two chambers separated from each other by an electrically conducting wall, wherein in a first chamber the energy reservoir and the signal generator are arranged, and wherein in a second chamber the coupling interface is arranged.

6. The signal generating device according to claim 5, wherein the switching device is arranged in the first chamber and wherein the plurality of load simulators and the plurality of current clamps are arranged in the second chamber.

7. The signal generating device according to claim 6, wherein in the second chamber comprises a plurality of removable electrically conducting walls, and wherein the plurality of load simulators are each separated from each other by one of the plurality of removable electrically conducting walls.

8. The signal generating device according to claim 5, wherein the housing comprises a first shell forming the first chamber and a second shell forming the second chamber, and wherein the second shell seals the first chamber in an assembled state and wherein a cover is provided for the second chamber.

9. The signal generating device according to claim 1, wherein the housing comprises an opening configured to allow access to the energy reservoir, and wherein a removable electrically conducting covering is provided and configured to seal the opening.

10. The signal generating device according to claim 1, wherein the housing comprises a ventilation opening having a honeycomb vent is disposed therein, wherein the ventilation opening configured to enable an air stream to the signal generator.

11. The signal generating device according to claim 1, wherein the data interface is configured as a light-based interface, and/or a line-based interface.

12. A measurement device for the electrical system according to claim 1, wherein the signal generating device is coupled on an input side to the electrical system, and the measurement device is coupled on an output side to the electrical system and is configured to detect electrical signals in the electrical system.

13. The measurement device according to claim 12, wherein the signal generating device is configured to be coupled to a high-voltage side of the electrical system and coupled to a low-voltage side of the electrical system, wherein the measurement device comprises a low-voltage load simulator.

\* \* \* \* \*